(12) United States Patent
Niimi et al.

(10) Patent No.: US 10,475,904 B2
(45) Date of Patent: Nov. 12, 2019

(54) METHODS OF FORMING MERGED SOURCE/DRAIN REGIONS ON INTEGRATED CIRCUIT PRODUCTS

(71) Applicant: GLOBALFOUNDRIES Inc., Grand Cayman (KY)

(72) Inventors: Hiroaki Niimi, Cohoes, NY (US); Steven Bentley, Menands, NY (US); Romain Lallement, Troy, NY (US); Brent A. Anderson, Jericho, VT (US); Junli Wang, Slingerlands, NY (US); Muthumanickam Sankarapandian, Niskayuna, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 51 days.

(21) Appl. No.: 15/868,004

(22) Filed: Jan. 11, 2018

(65) Prior Publication Data

US 2019/0214484 A1    Jul. 11, 2019

(51) Int. Cl.
*H01L 29/66*        (2006.01)
*H01L 29/778*       (2006.01)
(Continued)

(52) U.S. Cl.
CPC .......... *H01L 29/66666* (2013.01); *H01L 21/823418* (2013.01); *H01L 21/823807* (2013.01);
(Continued)

(58) Field of Classification Search
CPC ....... H01L 29/66666; H01L 21/823418; H01L 21/823807; H01L 27/092; H01L 27/1104;
(Continued)

(56) References Cited

U.S. PATENT DOCUMENTS 7,670,934 B1 * 3/2010 Pal ................. H01L 21/823412
257/E21.09
9,761,722 B1 * 9/2017 Jagannathan ......... H01L 29/785
(Continued)

*Primary Examiner* — Mouloucoulaye Inoussa
(74) *Attorney, Agent, or Firm* — Amerson Law Firm, PLLC

(57) ABSTRACT

A method of forming a merged source/drain region is disclosed that includes forming first and second VOCS structures above a semiconductor substrate, forming a recess in the substrate between the first and second VOCS structures and forming a P-type-doped semiconductor material in the recess. In this particular example, the method also includes removing a first substantially horizontally-oriented portion of the P-type-doped semiconductor material from within the recess while leaving a second substantially horizontally-oriented portion of the P-type-doped semiconductor material remaining in the recess and forming a substantially horizontally-oriented N-type-doped semiconductor material in the recess laterally adjacent the second substantially horizontally-oriented portion of the P-type-doped semiconductor material, wherein the substantially horizontally-oriented N-type-doped semiconductor material physically engages the second substantially horizontally-oriented portion of the P-type-doped semiconductor material along an interface within the merged source/drain region.

19 Claims, 16 Drawing Sheets

(51) Int. Cl.
*H01L 27/092* (2006.01)
*H01L 21/8234* (2006.01)
*H01L 27/11* (2006.01)
*H01L 21/8238* (2006.01)

(52) U.S. Cl.
CPC ........ *H01L 27/092* (2013.01); *H01L 27/1104* (2013.01); *H01L 29/7788* (2013.01)

(58) Field of Classification Search
CPC ......... H01L 29/7788; H01L 21/823821; H01L 21/2256; H01L 21/324; H01L 29/0649; H01L 27/0924; H01L 21/823892; H01L 29/66803; H01L 21/308; H01L 21/823431; H01L 21/823468; H01L 21/823481; H01L 29/167; H01L 21/823878; H01L 29/7851; H01L 29/6681; H01L 21/30604; H01L 21/02532; H01L 29/161; H01L 29/165; H01L 21/02271; H01L 21/02282; H01L 29/1037; H01L 29/0669; H01L 21/823828; H01L 29/6653; H01L 29/66628; H01L 29/66636; H01L 29/7848; H01L 29/0847; H01L 29/6656; H01L 21/823412; H01L 21/823814; H01L 21/84

USPC ................. 257/369, 192, E21.635, E21.639, 257/E27.062; 438/232, 283, 230, 278, 438/197, 275, 481

See application file for complete search history.

(56) References Cited

U.S. PATENT DOCUMENTS

| | | | |
|---|---|---|---|
| 9,842,933 B1* | 12/2017 | Niimi | H01L 29/66666 |
| 9,911,738 B1* | 3/2018 | Niimi | H01L 27/092 |
| 2014/0138773 A1* | 5/2014 | Cheng | H01L 21/3086 257/347 |
| 2015/0364603 A1* | 12/2015 | Cheng | H01L 29/7851 257/192 |

* cited by examiner

METHODS OF FORMING MERGED SOURCE/DRAIN REGIONS ON INTEGRATED CIRCUIT PRODUCTS

BACKGROUND OF THE INVENTION

1. Field of the Invention

The present disclosure generally relates to the fabrication of semiconductor devices, and, more particularly, to various methods of forming merged source/drain regions on integrated circuit (IC) products.

2. Description of the Related Art

In general, transistor devices may have a variety of different configurations, e.g., planar devices, FinFET devices, nanowire/nanosheet devices, vertical transport transistor devices, etc. In a vertical transport transistor device, there is a channel semiconductor structure that is oriented substantially vertically relative to an upper surface of a semiconductor substrate. Additionally, in such a vertical transport transistor device, there is a bottom doped source/drain region formed for each of the vertical transport transistor devices. IC products formed using CMOS (Complementary Metal-Oxide-Semiconductor) technology involve the formation of both N-type and P-type transistors in and above the substrate. In some specific applications, such IC products include N-type and P-type transistors that are formed on a same substrate wherein their respective source/drain regions are merged together. In general, such a merged doped bottom source/drain region comprises a P-type-doped region that physically engages an N-type-doped region. Such a region is said to be "merged" in the sense that there is no isolation material positioned between these inversely doped regions within the merged source/drain region, i.e., the P-type-doped region directly engages the N-type-doped region within the merged source/drain region along an interface. This merged source/drain region connects the source/drain regions of at least one P-type transistor to at least one N-type transistor. For such a merged source/drain region to serve its intended function, the two inversely doped regions must physically contact one another.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming merged source/drain regions on integrated circuit (IC) products. One illustrative method disclosed herein for forming a merged source/drain region includes forming first and second vertically oriented channel semiconductor (VOCS) structures above a semiconductor substrate, forming a recess in the substrate between the first and second VOCS structures and forming a P-type-doped semiconductor material in the recess. In this particular example, the method also includes removing a first substantially horizontally-oriented portion of the P-type-doped semiconductor material from within the recess while leaving a second substantially horizontally-oriented portion of the P-type-doped semiconductor material remaining in the recess and forming a substantially horizontally-oriented N-type-doped semiconductor material in the recess laterally adjacent the second substantially horizontally-oriented portion of the P-type-doped semiconductor material, wherein the substantially horizontally-oriented N-type-doped semiconductor material physically engages the second substantially horizontally-oriented portion of the P-type-doped semiconductor material along an interface within the merged source/drain region.

BRIEF DESCRIPTION OF THE DRAWINGS

The disclosure may be understood by reference to the following description taken in conjunction with the accompanying drawings, in which like reference numerals identify like elements, and in which.

Figure 1:
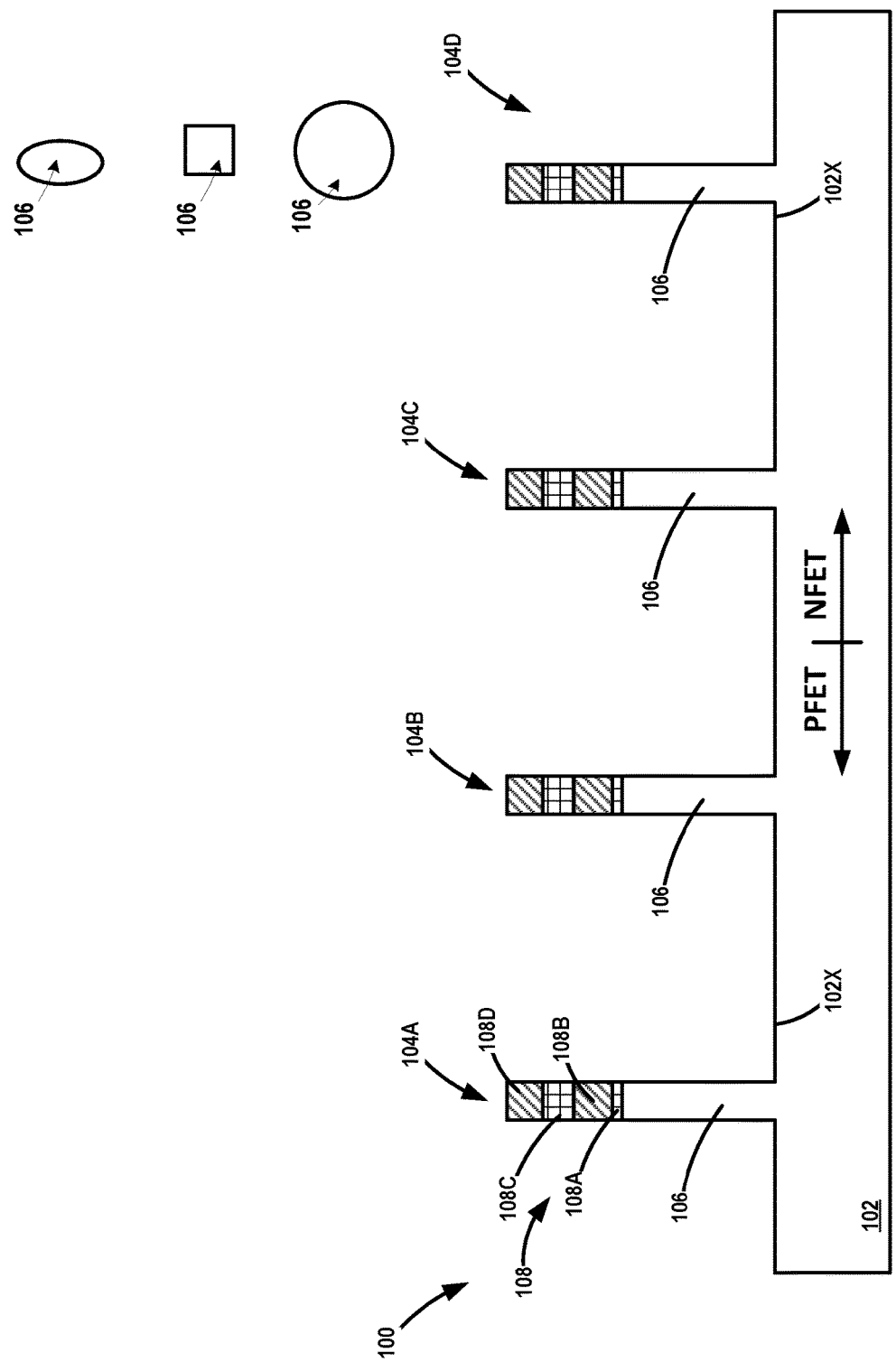
FIGS. 1-16 are various views that depict various methods of forming merged source/drain regions on IC products.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. The various layers of material described below may be formed by any of a variety of different known techniques, e.g., a chemical vapor deposition (CVD) process, an atomic layer deposition (ALD) process, a thermal growth process, epitaxial growth processes, spin-coating techniques, etc. Moreover, as used herein and in the attached claims, the word "adjacent" is to be given a broad interpretation and should be interpreted to cover situations where one feature actually contacts another feature or is in close proximity to that other feature.

Figure 2:
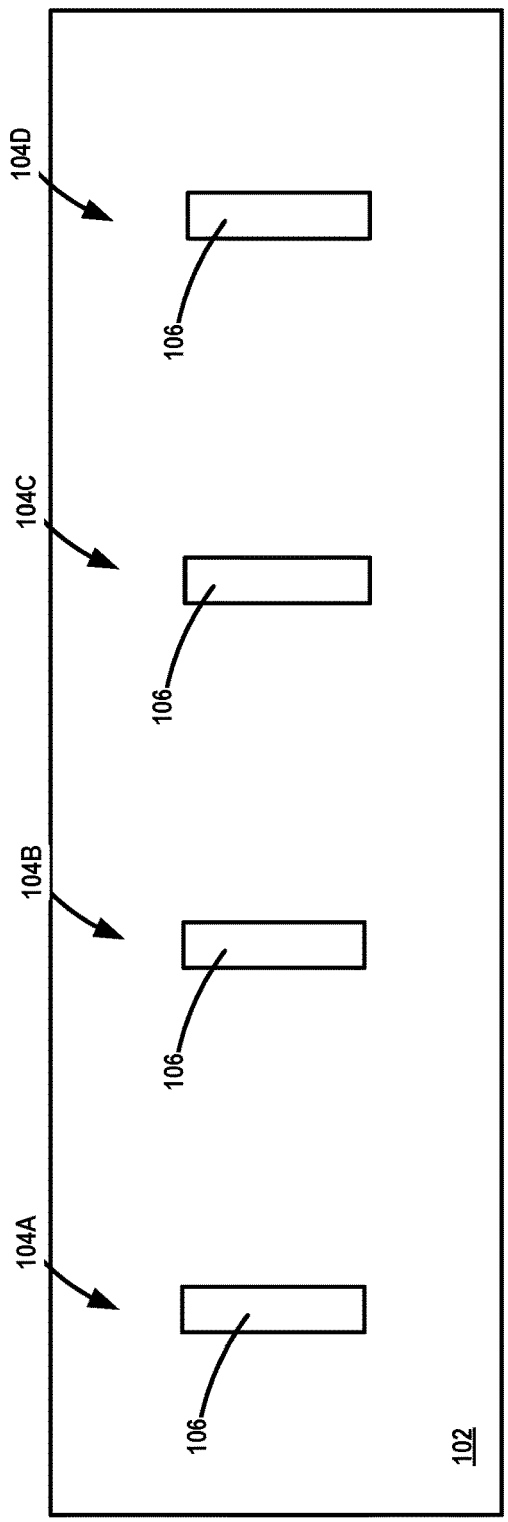

FIGS. 1-16 are various views that depict various methods of forming merged source/drain regions on an IC product 100. FIGS. 1 and 2 are, respectively, a cross-sectional view and a simplistic plan view (with the patterned etch mask 108 removed) of the product 100. The product 100 includes four illustrative and schematically depicted vertical transport transistor devices 104A-104D (generally referenced using the numeral 104) that are formed above a semiconductor substrate 102. In the depicted example, the vertical transport transistors 104A and 104B are P-type transistor devices, while the transistors 104C and 104D are N-type transistor devices. Each of the vertical transport transistors 104 includes a simplistically depicted vertically oriented channel semiconductor (VOCS) structure 106.

As will be described more fully below, and with reference to FIGS. 14 and 15, after fabrication is completed, a merged doped bottom source/drain region 129 will be formed between the P-type transistor 104B and the N-type transistor 104C. The merged doped source/drain region 129 will comprise a P-type-doped bottom region 116 and an N-type-doped bottom region 124. As described more fully below, these N-type and P-type doped regions may be formed in a semiconductor material, i.e., either in an epitaxial semiconductor material formed above a semiconductor substrate 102 or in the semiconductor substrate 102 itself. These N-type and P-type doped regions 116, 124 are "merged" in the sense that there is no isolation material positioned between these inversely doped regions within the merged doped source/drain region 129, e.g., the P-type-doped region 116 directly engages the N-type-doped region 124 within the merged doped source/drain region 129 along an interface 129A.

FIGS. 1-16 are cross-sectional views depicting one illustrative process flow for forming a merged doped source/drain region 129 on the IC product 100 disclosed herein. Of course, as will be appreciated by those skilled in the art after a complete reading of the present application, the vertical transport transistor devices 104 disclosed herein may be formed using a variety of different manufacturing techniques and materials, and such transistors 104 may have a variety of different configurations. Thus, the presently disclosed inventions should not be considered to be limited to any particular form of transistor device, its materials of construction or the manner in which it is formed. The product 100 is formed in and above a semiconductor substrate 102. The substrate 102 may have a variety of configurations, such as the bulk substrate configuration depicted herein or a semiconductor-on-insulator (SOI) configuration. Such an SOI substrate includes a bulk semiconductor layer, a buried insulation layer positioned on the bulk semiconductor layer and an active semiconductor layer positioned on the buried insulation layer, wherein the transistor devices 104 are formed in and above the active layer. The active layer and/or the bulk semiconductor layer may be made of silicon or they may be made of semiconductor materials other than silicon, and they both do not have to be made of the same semiconductor material. Thus, the terms "substrate" or "semiconductor substrate" should be understood to cover all semiconducting materials and all forms of such materials.

FIGS. 1 and 2 are, respectively, a cross-sectional view and a simplistic plan view (with the patterned etch mask 108 removed) of the product 100. FIGS. 1 and 2 depict the product 100 after several process operations were performed. First, the VOCS structures 106 for the transistors 104 were formed by performing one or more etching processes through a patterned etch mask 108 so as to define a plurality of trenches 102X in the substrate 102. The VOCS structures 106 may be of any desired physical size, and they may have a variety of different configurations. In the illustrated examples, the VOCS structures 106 have a substantially rectangular cross-section when viewed from above, as shown in the simplistic plan view in FIG. 2. In other embodiments, the VOCS structures 106 may have a different cross-sectional shape, such as circle, oval, square, etc., as shown in the upper right-hand portion of FIG. 1. In some embodiments, the patterned etch mask 108 may be comprised of one or more layers of material. In one particularly illustrative embodiment, the patterned etch mask 108 may be a multi-layer etch mask that is comprised of a first layer of silicon dioxide 108A (e.g., 1-2 nm), a first layer of silicon nitride 108B (e.g., 3-5 nm), a second layer of silicon dioxide 108C (e.g., 1-5 nm) and a second layer of silicon nitride 108D (e.g., 3-4 nm). The patterned etch mask 108 may be formed by sequentially depositing the layers of material comprising the patterned etch mask 108 above the substrate 102, and thereafter patterning the layers of material for the patterned etch mask 108 using known photolithography and etching techniques.

Figure 3:
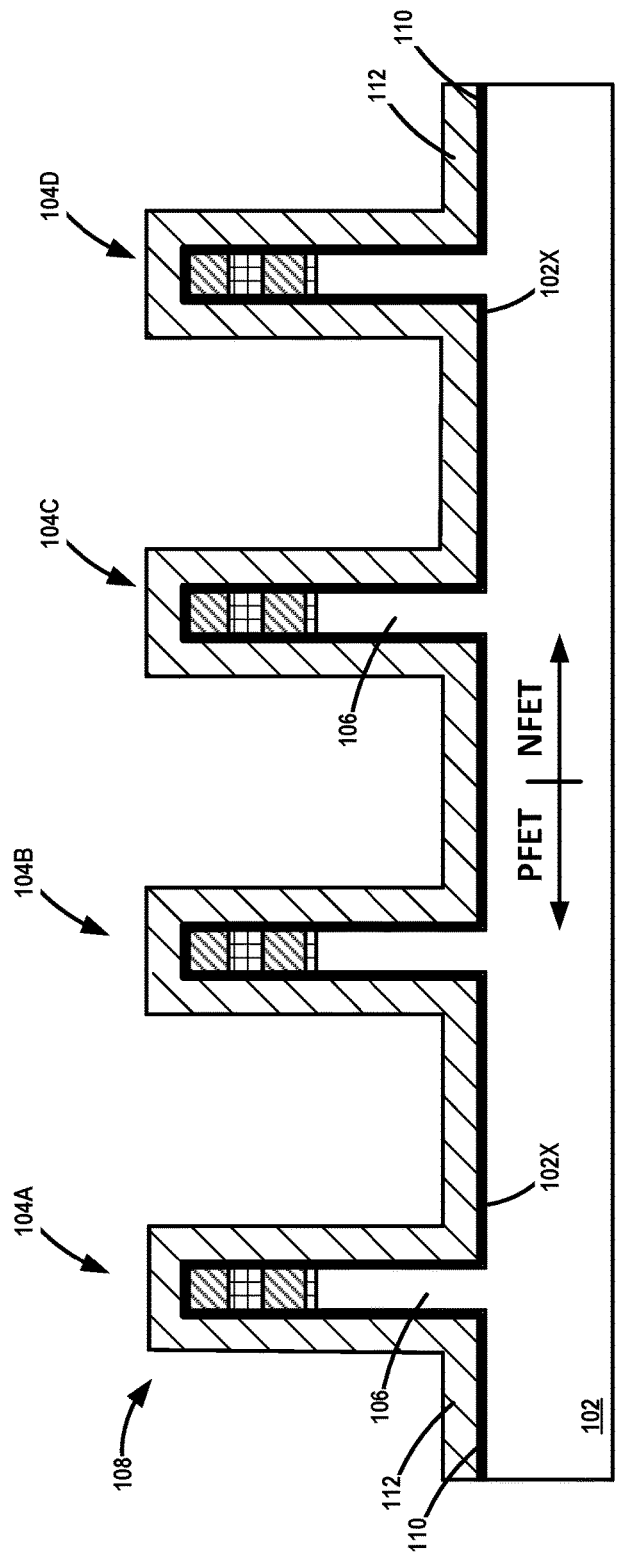

FIG. 3 depicts the product 100 after several process operations were performed. First, a conformal deposition process, e.g., an atomic layer deposition (ALD) process, was performed to form a relatively thin (e.g., 2-5 nm) conformal insulating liner layer 110. The insulating liner layer 110 may be comprised of an insulating material such as silicon dioxide. Next, another conformal deposition process was performed to form a conformal layer of spacer material 112 on the insulating liner layer 110 and between and around the VOCS structures 106 for all of the transistors 104. The conformal layer of spacer material 112 may be formed to any desired thickness (e.g., 2-10 nm), and it may be comprised of any desired insulating material, e.g., silicon nitride, SiBCN, SiCO, SiOCN, etc. In general, the conformal layer of spacer material 112 should be made of a material that exhibits good etch selectivity relative to the material selected for the insulating liner layer 110.

Figure 4:
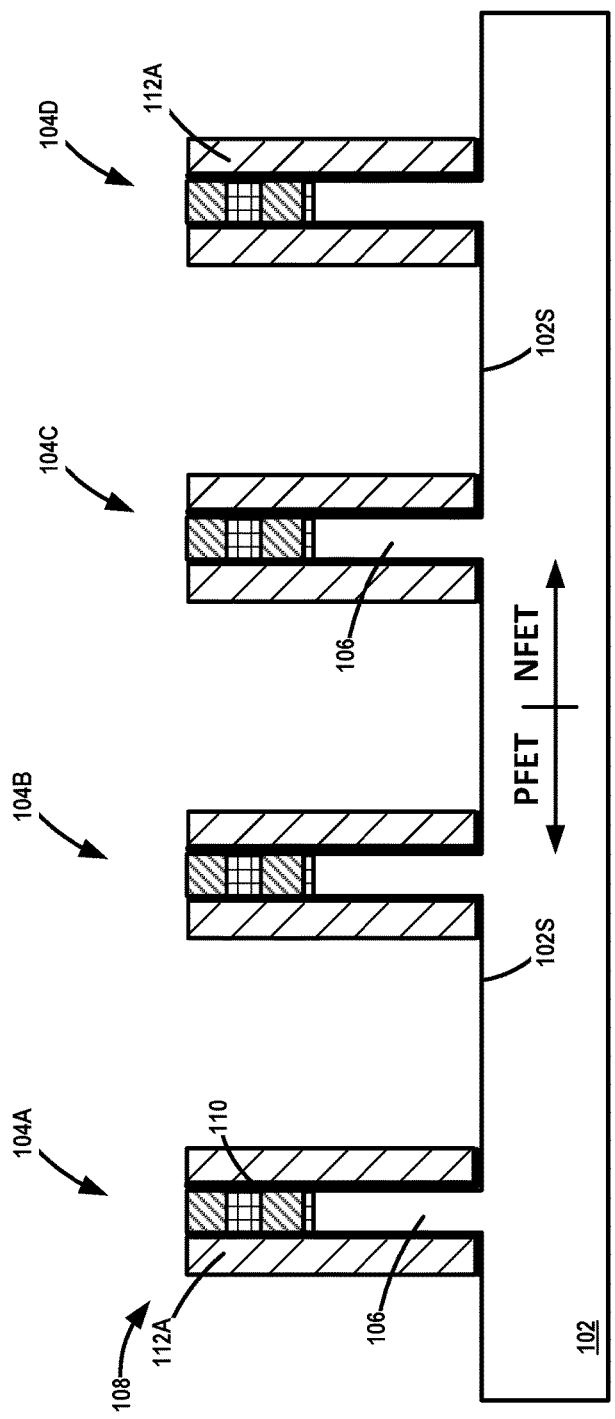

FIG. 4 depicts the product 100 after several process operations were performed. First, an anisotropic etching process (e.g., an RIE process) was performed to remove substantially horizontally oriented portions of the conformal layer of spacer material 112. This process operation results in a simplistically-depicted sidewall spacer 112A positioned adjacent the sidewalls of the VOCS structure 106 for each of the transistors 104. The thickness of the sidewall spacer 112A (at its base) may vary depending upon the particular application. Thereafter, another etching process was performed to remove the portions of the insulating liner layer 110 not covered by the sidewall spacers 112A. This process operation exposes portions of the surface 102S of the substrate 102 between the sidewall spacer 112A positioned adjacent the VOCS structures 106.

Figure 5:
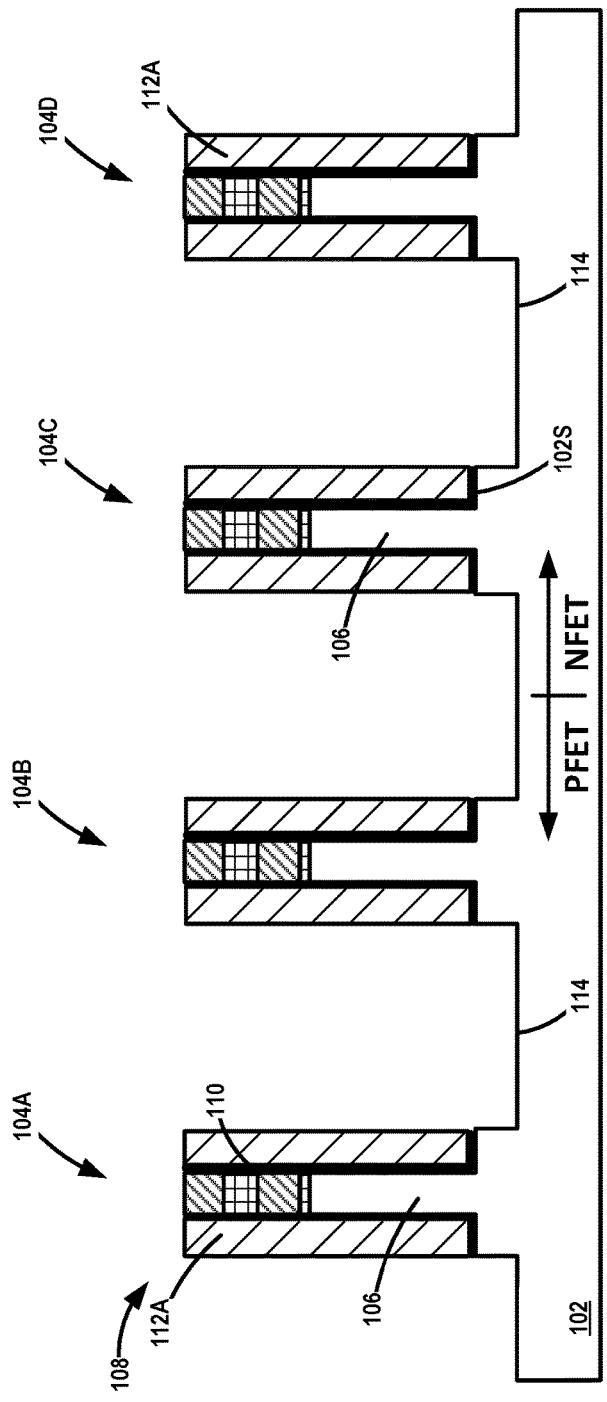

FIG. 5 depicts the product 100 after at least one anisotropic, recess etching process was performed to remove exposed portions of the substrate 102 and thereby define or form a plurality of recesses 114 in the substrate 102. The vertical depth of the recesses 114 below the upper surface 102S of the substrate 102 may vary depending upon the particular application (e.g., 10-40 nm). If desired, at or near the end of the anisotropic etching process, a relatively brief isotropic etching process may be performed to extend the lateral width of the recesses 114 such that the edges of the recesses 114 are positioned under the spacers 112A to at least some degree. However, such lateral expansion of the trenches 114 is not depicted in the attached drawings.

Figure 6:
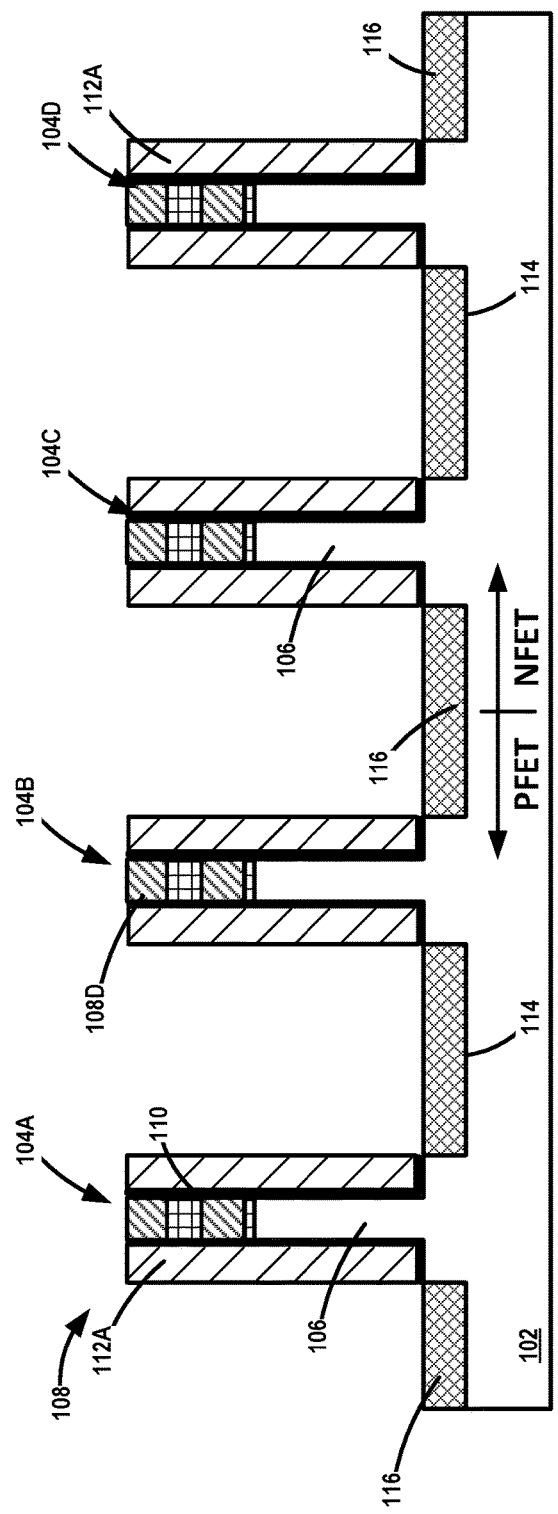
Figure 7:
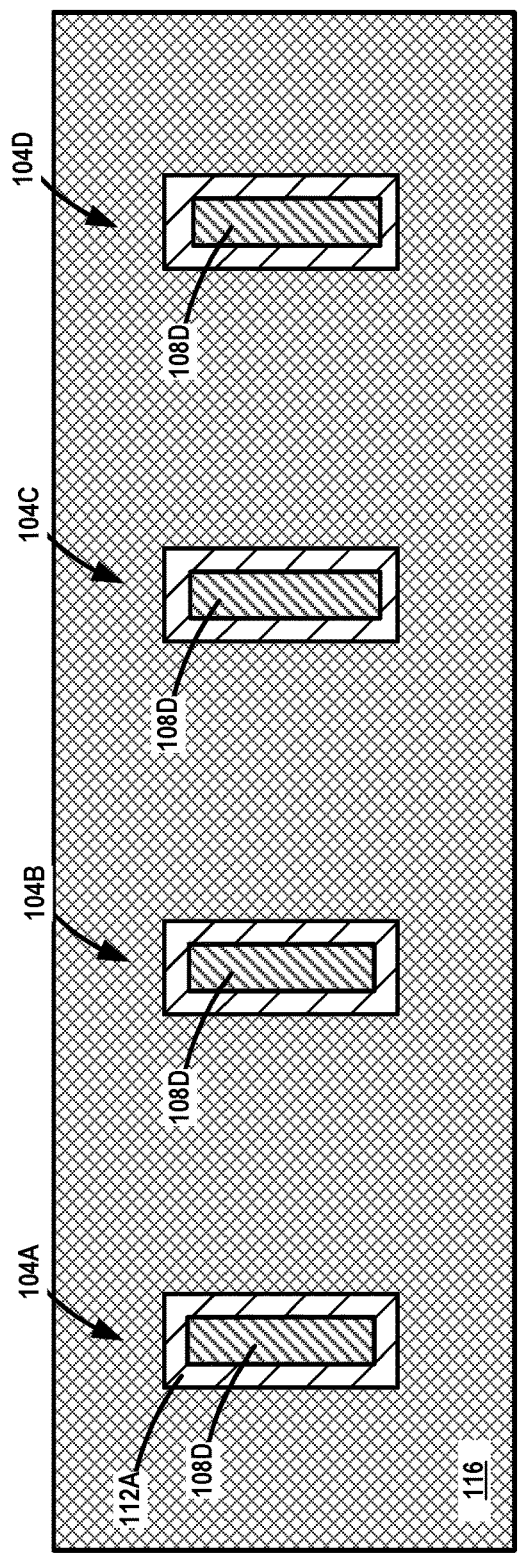

FIGS. 6 and 7 are, respectively, a cross-sectional view and a simplistic plan view of the product 100. FIGS. 6 and 7 depict the product 100 after an epitaxial growth process was performed to form a substantially horizontally-oriented P-type-doped layer of epitaxy semiconductor material 116 in the recesses 114 around the VOCS structures 106. The P-type-doped layer of epitaxy semiconductor material 116 may be formed to any desired thickness, it may be formed from a variety of different materials, and it may be formed using a variety of manufacturing techniques. In one illustrative embodiment, the P-type-doped layer of epitaxy semiconductor material 116 may be formed by performing an epitaxial growth process while introducing a P-type dopant during the epitaxial growth process so as to form an in situ P-type-doped layer of epitaxy semiconductor material in the recesses 114. In another embodiment, an undoped layer of epitaxy semiconductor material (not shown) may be formed in the recesses 114, and thereafter an ion implantation process may be performed to implant P-type dopants into the undoped epitaxy semiconductor material formed in the recesses 114 thereby resulting in a substantially horizontally-oriented P-type-doped layer of epitaxy semiconductor material positioned within the recesses 114. In some applications, a combination of such techniques may be employed to form the P-type-doped layer of epitaxy semiconductor material. In one illustrative embodiment, the P-type-doped layer of epitaxy semiconductor material 116 may have a dopant concentration of about $10^{20}$-$10^{21}$ atoms/cm$^3$. A variety of P-type dopants, e.g., boron (B), boron difluoride (BF$_2$), gallium (Ga), etc., may be used to dope the P-type-doped layer of epitaxy semiconductor material 116 either by way of in situ doping or by way of ion implantation. The P-type-doped layer of epitaxy semiconductor material 116 may be comprised of a variety of different materials. For example, the P-type-doped layer of epitaxy semiconductor material 116 may be comprised of silicon germanium (SiGe) having a germanium concentration of about 30-60% (atomic percent). In one illustrative embodiment, the P-type-doped layer of epitaxy semiconductor material 116 should be made of a material that exhibits good etch selectivity relative to the material of the substrate 102.

Figure 8:
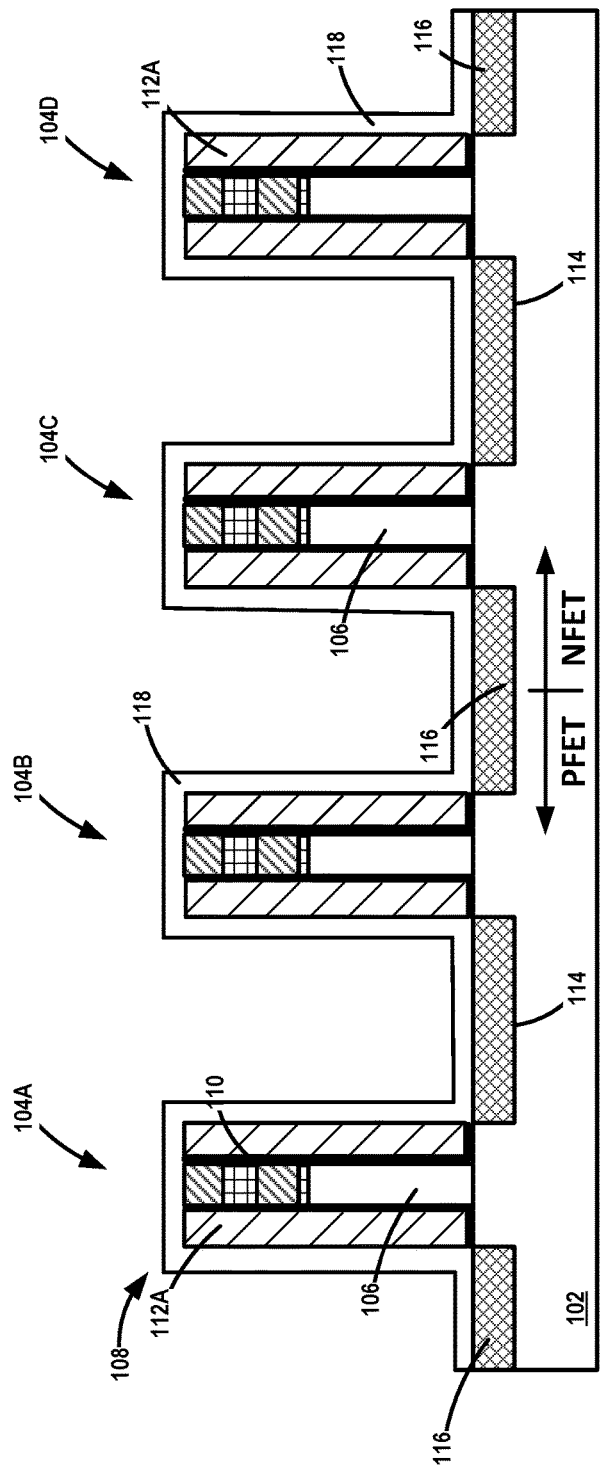

FIG. 8 depicts the product 100 after another conformal deposition process, e.g., an atomic layer deposition (ALD) process, was performed to form a relatively thin (e.g., 2-10 nm) conformal insulating liner layer 118. The insulating liner layer 118 may be comprised of an insulating material such as silicon nitride.

Figure 9:
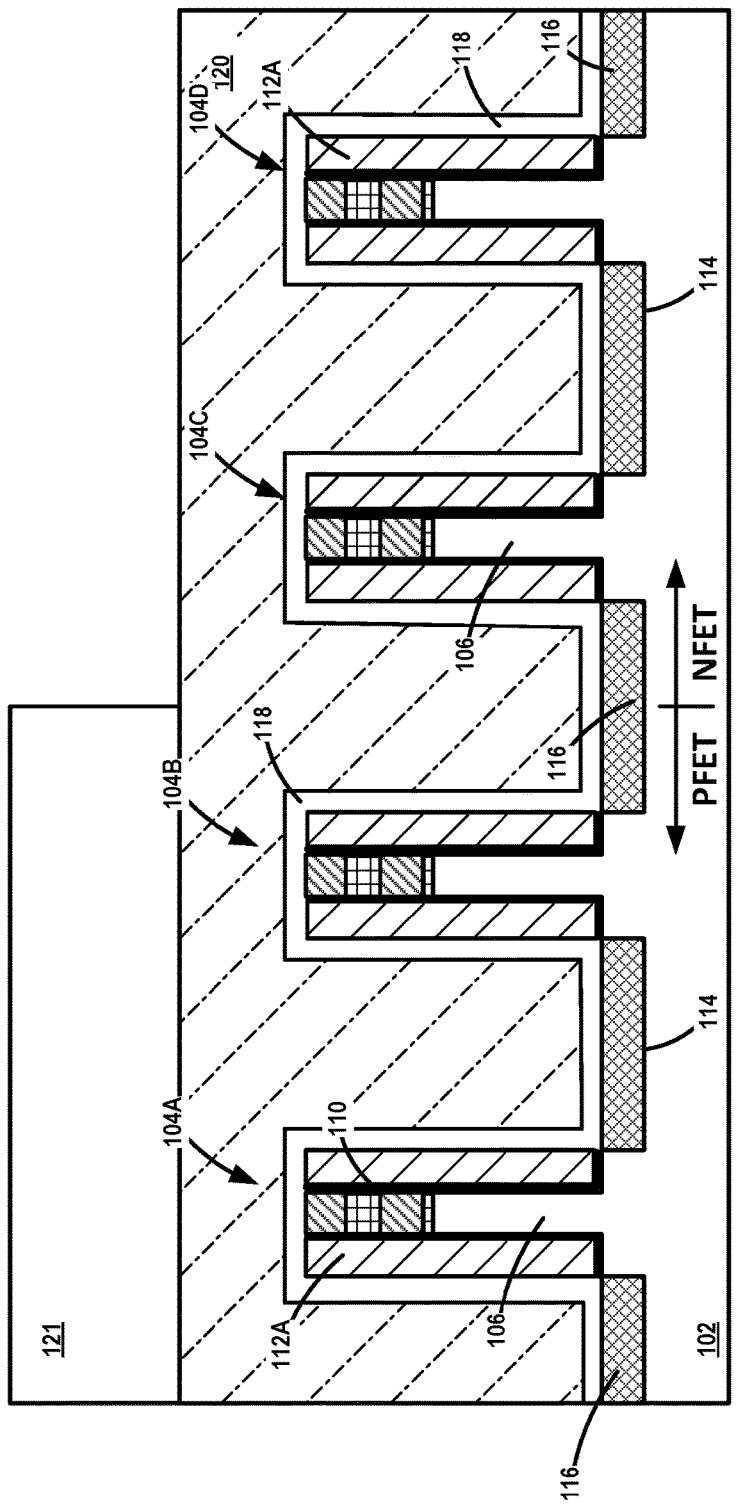

FIG. 9 depicts the product 100 after several process operations were performed. First, a layer of masking material 120, e.g., an ODL layer, was blanket-deposited on the product 100. Thereafter, a patterned etch mask 121, e.g., a patterned layer of photoresist, was formed above the deposited layer of ODL material 120. Such a patterned etch mask comprised of photoresist material may be formed using known photolithography techniques. As depicted, the patterned etch mask 121 exposes the layer of masking material 120 positioned above the N-type transistors 104C, 104D for further processing. Note that, using the methods disclosed herein, the merged source/drain region 129 may be formed using only a single patterned masking layer 121, as compared to other process flows wherein two such patterned masking layers are formed when trying to form a merged source/drain region using ion implantation techniques.

Figure 10:
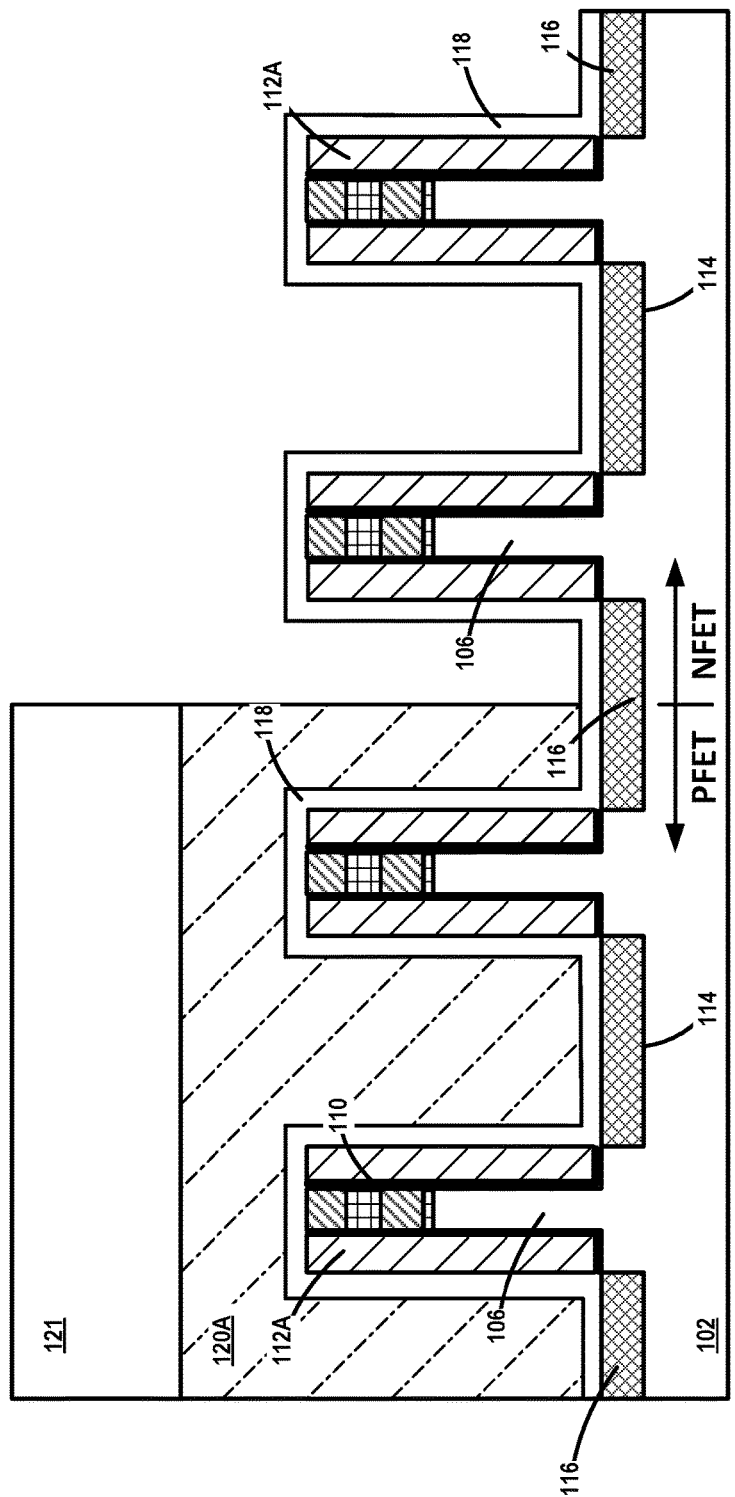

FIG. 10 depicts the product 100 after an etching process was performed through the opening in the patterned etch mask 121 to define a patterned etch mask 120A comprised of the masking material 120. As depicted, this process operation exposes the area above the N-type transistors 104C, 104D for further processing.

Figure 11:
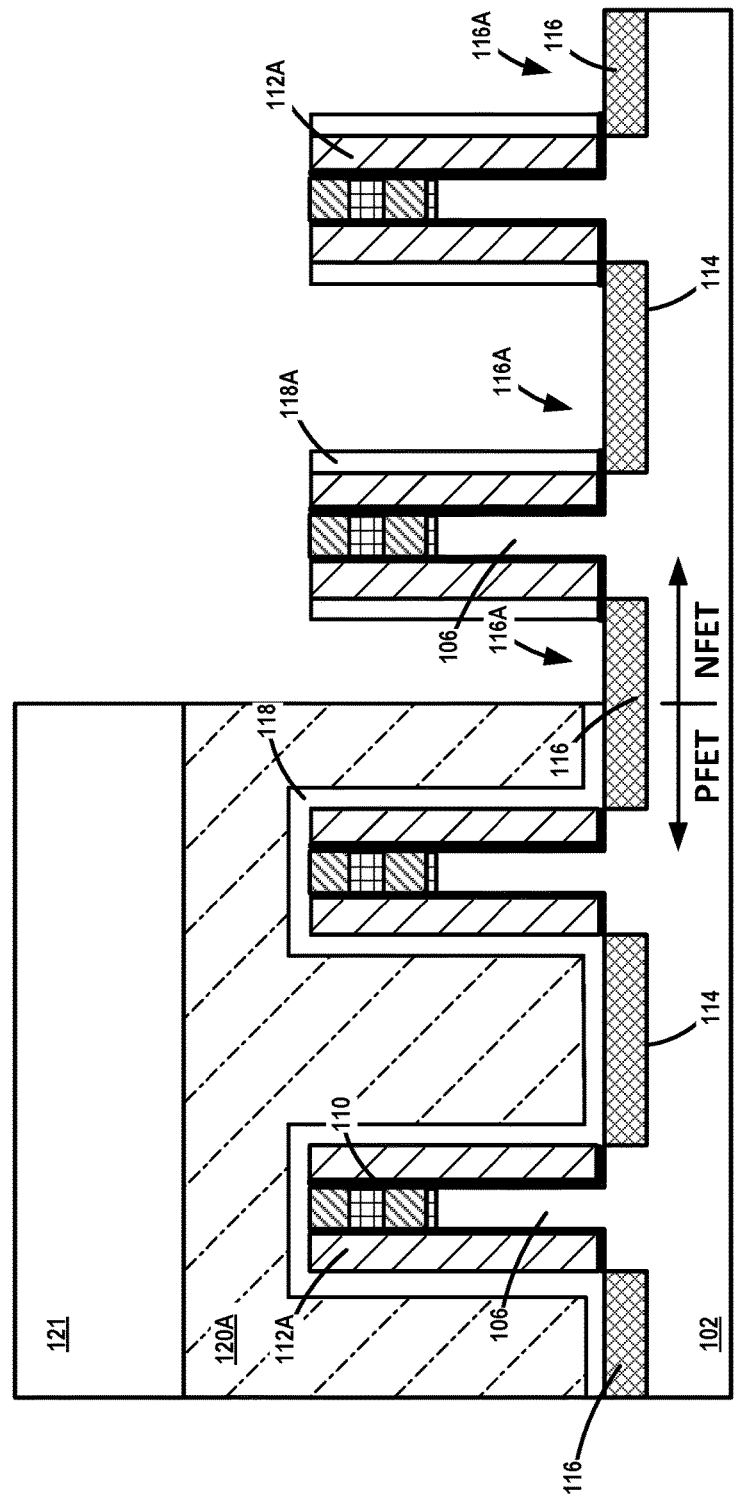

FIG. 11 depicts the product 100 after an anisotropic etching process (e.g., an RIE process) was performed through the opening in the patterned etch mask 120A to remove substantially horizontally oriented portions of the exposed portion of the insulating liner layer 118 positioned above the N-type transistors 104C, 104D. This process operation results in the formation of simplistically-depicted sidewall spacers 118A positioned adjacent the sidewalls of the VOCS structure 106 for each of the N-type transistors 104C, 104D. The thickness of the sidewall spacer 118A (at its base) may vary depending upon the particular application. As depicted, this process operation exposes a first substantially horizontally-oriented portion 116A of the P-type-doped layer of epitaxy semiconductor material 116 positioned adjacent the N-type transistors 104C, 104D for further processing. The patterned etch mask 121 may be removed prior to performing this etching process or the patterned etch mask 121 may remain in position during this etching process.

Figure 12:
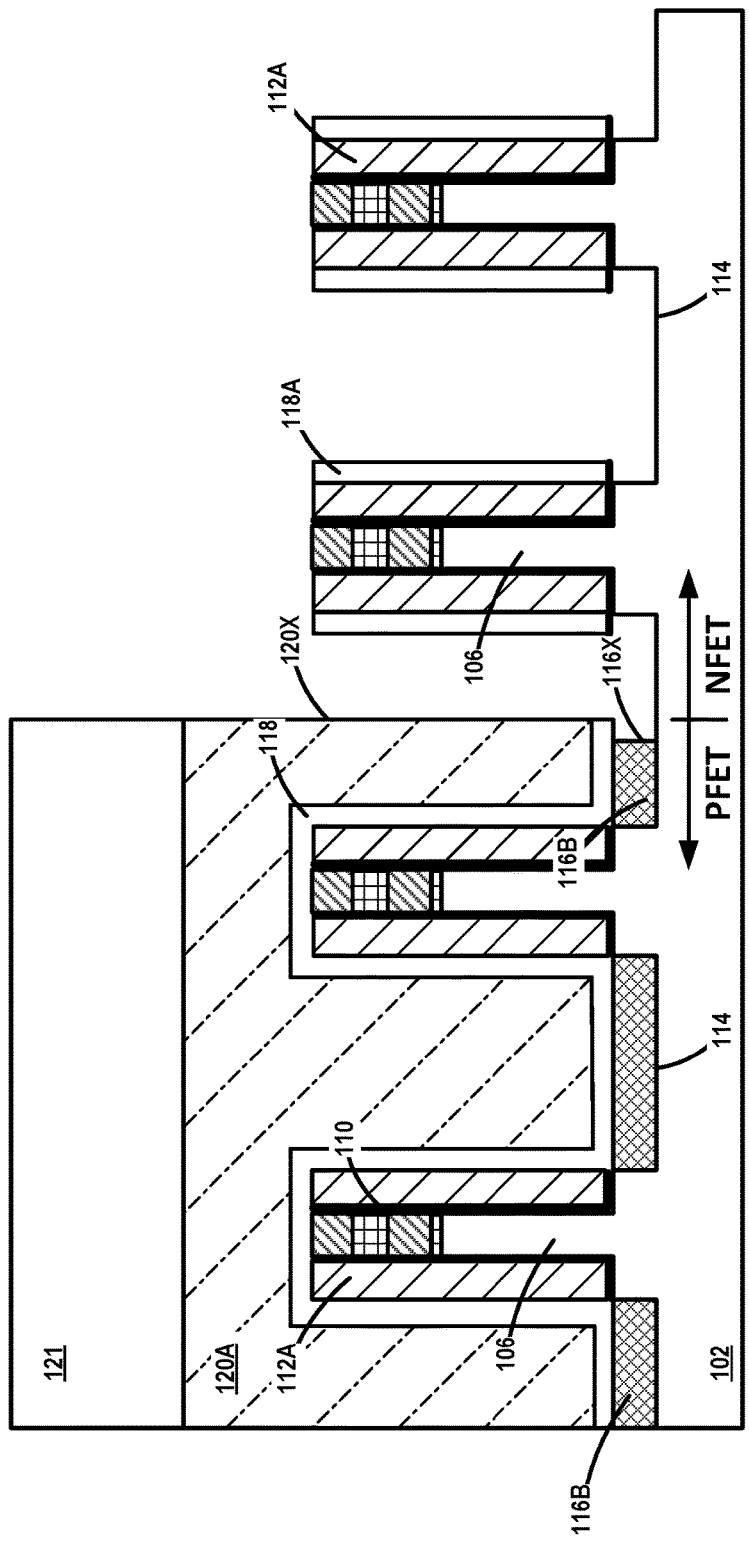

FIG. 12 depicts the product 100 after an etching process was performed through the patterned etch mask 120A to remove the first substantially horizontally-oriented portion 116A (see FIG. 11) of the P-type-doped layer of epitaxy semiconductor material 116 positioned adjacent the N-type transistors 104C, 104D while leaving a second substantially horizontally-oriented portion 116B of the P-type-doped layer of epitaxy semiconductor material 116 positioned within the recesses 114 adjacent the P-type transistors 104A, 104B. Note that the second substantially horizontally-oriented portion 116B of the P-type-doped layer of epitaxy semiconductor material 116 still remains positioned in a portion of the recess 114 between the second and third transistors 104B, 104C, while another portion of that particular recess 114 has been cleared of the first substantially horizontally-oriented P-type-doped layer of epitaxy semiconductor material 116. In one illustrative example, the remaining second substantially horizontally-oriented portion 116B of the P-type-doped layer of epitaxy semiconductor material 116 has a substantially vertically oriented etched surface 116X.

In one illustrative example, this etching process comprises a dry anisotropic etching process wherein the etched edge 116X of the remaining portion 116B of the P-type-doped layer of epitaxy semiconductor material 116 would be substantially self-aligned with the edge 120X of the patterned etch mask 120A (a situation not depicted in the drawings). In other embodiments, after or near the completion of an initial dry anisotropic etching process performed to remove the exposed portion 116A of the P-type-doped layer of epitaxy semiconductor material 116, a brief wet isotropic etching process may be performed to complete the removal of the first substantially horizontally-oriented portion 116A of the P-type-doped layer of epitaxy semiconductor material 116, i.e., the portion of the first substantially horizontally-oriented portion 116A of the P-type-doped layer of epitaxy semiconductor material 116 positioned under the spacers 118A on the N-type transistors 104C, 104D. This recess etching process may also recess the second substantially horizontally-oriented portion 116B of the P-type-doped layer of epitaxy semiconductor material 116 laterally (to a relatively slight degree) under the edge 120X of the patterned etch mask 120A, as depicted by the etched edge 116X of the P-type-doped layer of epitaxy semiconductor material 116B shown in FIG. 12. The amount of recessing (if such recessing is performed) may vary depending upon the particular application. The patterned etch mask 121 may be removed prior to performing this etching process or the patterned etch mask 121 may remain in position during this etching process.

Figure 13:
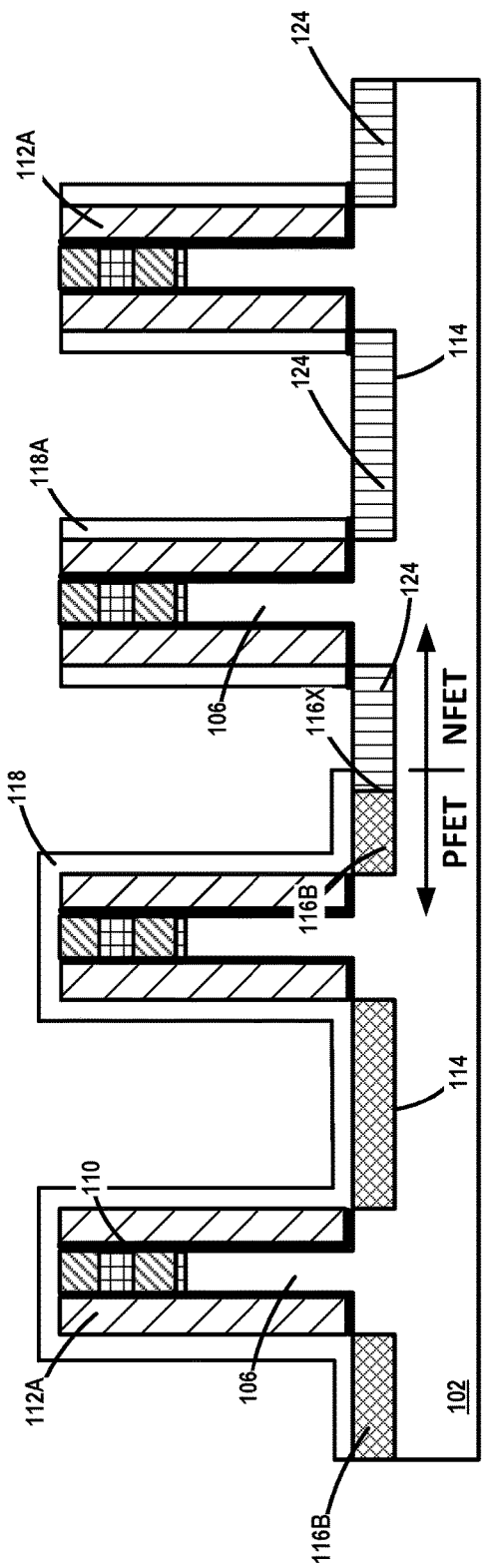

FIG. 13 depicts the product 100 after several process operations were performed. First, the patterned etch mask 120A (and the patterned etch mask 121, if present) were removed from above the substrate 102. Next, another epitaxial deposition process was performed to form a substantially horizontally-oriented, in situ N-type-doped layer of epitaxy semiconductor material 124 in the recesses 114 in the spaces formerly occupied by the now-removed first substantially horizontally-oriented portion 116A of the P-type-doped layer of epitaxy semiconductor material 116. The substantially horizontally-oriented N-type-doped layer of epitaxy semiconductor material 124 may be formed to any desired thickness, it may be formed from a variety of different materials, and it may be formed using a variety of manufacturing techniques. In one illustrative embodiment, the substantially horizontally-oriented N-type-doped layer of epitaxy semiconductor material 124 may be formed by performing an epitaxial growth process while introducing an N-type dopant during the epitaxial growth process so as to form a substantially horizontally-oriented in situ N-type-doped layer of epitaxy semiconductor material 124 in the empty portions of the recesses 114 positioned adjacent the N-type transistors 104C, 104D. If desired, ion implantation may additionally be performed following the epitaxial growth process. As depicted, the substantially horizontally-oriented N-type-doped semiconductor material 124 is formed in the empty portion of the recess 114 laterally adjacent the second substantially horizontally-oriented portion 116B of the P-type-doped semiconductor material 116. The substantially horizontally-oriented N-type-doped semiconductor material 124 in the recess 114 physically engages the second substantially horizontally-oriented portion 116B of the P-type-doped semiconductor material along an interface 129A (see FIG. 14). In one illustrative embodiment, the N-type-doped layer of epitaxy semiconductor material 124 may have a dopant concentration of about $5 \times 10^{20}$-$5 \times 10^{21}$ atoms/cm$^3$. A variety of N-type dopants, e.g., phosphorous (P), arsenic (As), etc., may be used to dope the N-type-doped layer of epitaxy semiconductor material 124. The N-type-doped epitaxy semiconductor material 124 may be comprised of a variety of different materials. For example, the N-type-doped layer of epitaxy semiconductor material 124 may be comprised of phosphorous doped silicon (Si:P), arsenic doped silicon (Si:As), etc.

Figure 14:
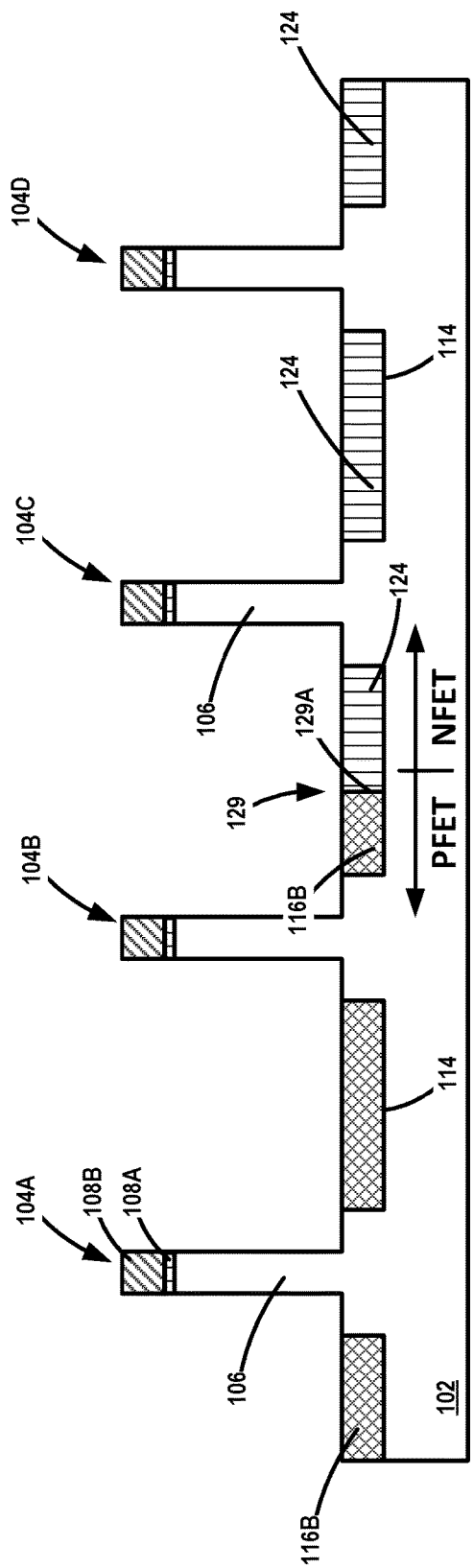
Figure 15:
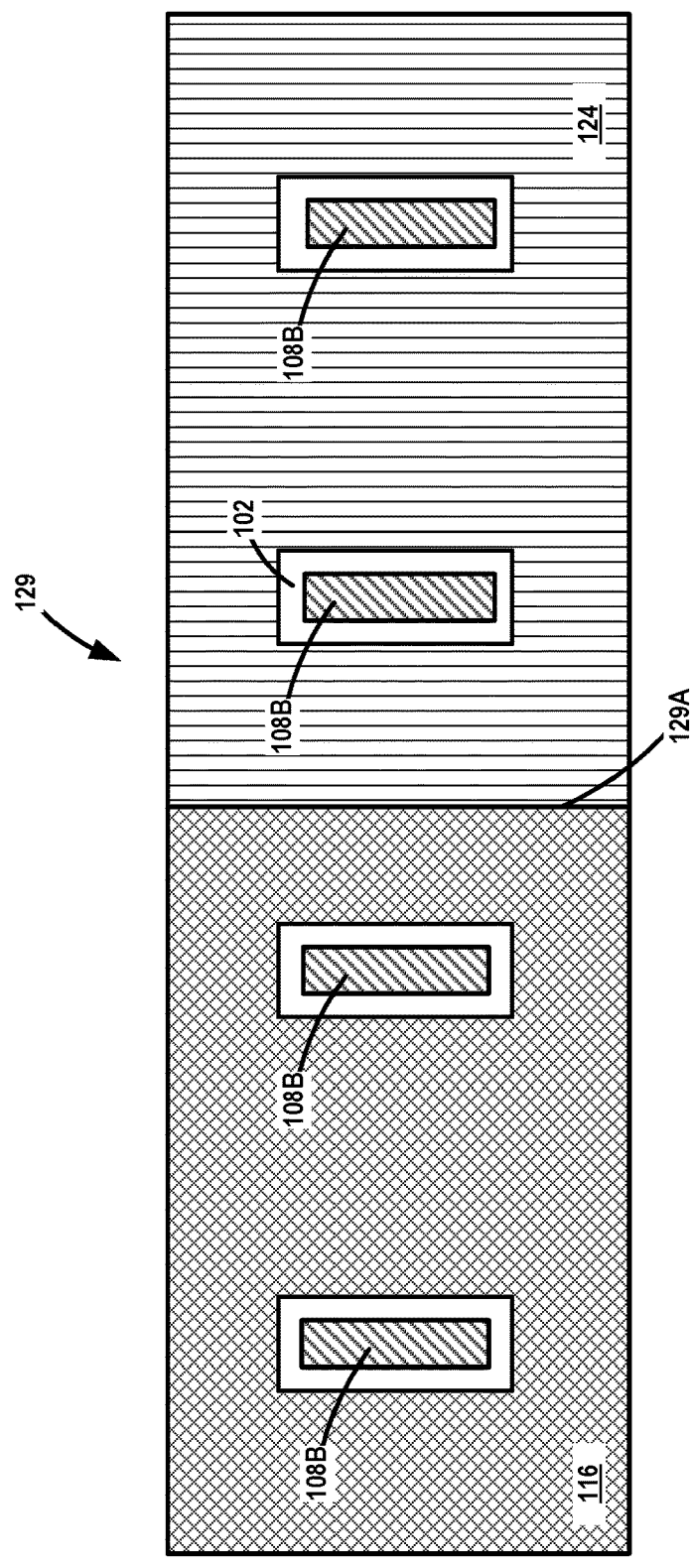

FIGS. 14 and 15 are, respectively, a cross-sectional view and a simplistic plan view of the product 100. FIGS. 14 and 15 depict the product 100 after several etching process operations were performed to remove the remaining portions of the insulating liner layer 118 (including the sidewall spacers 118A), the sidewall spacers 112A, the insulating liner layer 110, the second layer of silicon nitride 108D and the second layer of silicon dioxide 108C. As depicted, at the completion of these etching processes, the first layer of silicon dioxide 108A and the first layer of silicon nitride 108B of the patterned etch mask 108 remain positioned above the VOCS structures 106. As depicted, the substantially horizontally-oriented P-type-doped layer of epitaxy semiconductor material 116B and the substantially horizontally-oriented N-type-doped layer of epitaxy semiconductor material 124 positioned between the P-type transistor 104B and the N-type transistor 104C constitute a merged source drain region 129, wherein the P-type-doped layer of epitaxy semiconductor material 116B and the N-type-doped layer of epitaxy semiconductor material 124 physically contact and engage one another along an interface 129A. In one illustrative example, the interface 129A between the substantially horizontally-oriented P-type-doped semiconductor material 116B and the substantially horizontally-oriented N-type-doped semiconductor material 124 in the merged source drain region 129 is a substantially vertically oriented interface 129A. The merged source/drain region 129 connects the P-type transistor 104B and the N-type transistor 104C.

Figure 16:
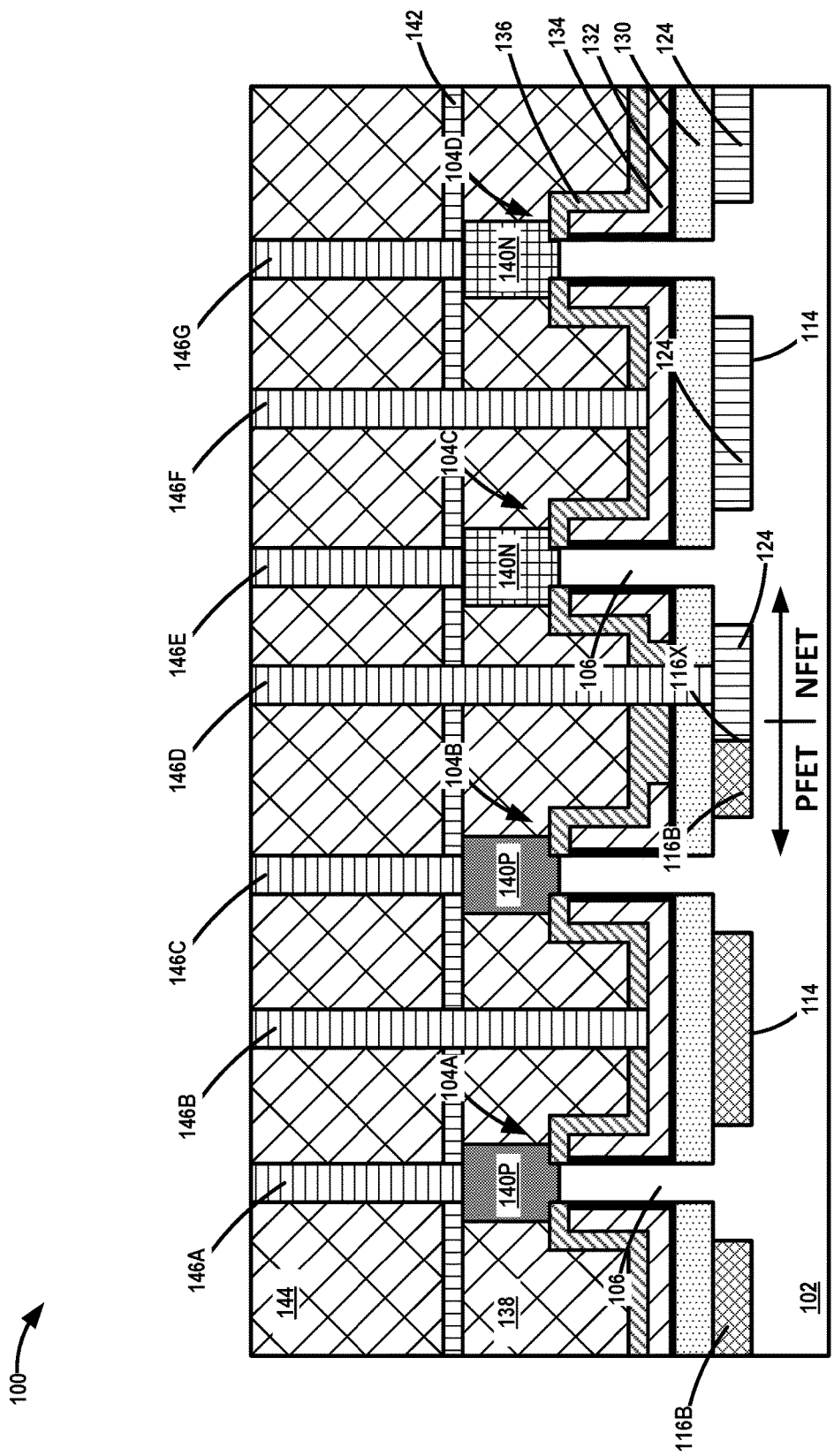

FIG. 16 depicts the product 100 after various known process operations were performed to complete the fabrication of the vertical transport transistor devices 104. Of course, as will be appreciated by those skilled in the art after a complete reading of the present application, the vertical transport transistor devices 104 disclosed herein may be formed using a variety of different manufacturing techniques and materials, and such transistors 104 may have a variety of different configurations. Thus, the presently disclosed inventions should not be considered to be limited to any particular form of vertical transport transistor device, its materials of construction or the manner in which it is formed.

Starting with the structure shown in FIG. 14, isolation regions (not shown) will be formed in the substrate 102 at the desired locations so as to electrically isolate the transistors 104 as required by the particular circuit being developed. FIG. 16 depicts several components of the illustrative vertical transport transistors 104 disclosed herein. In general, each of the transistors 104 comprises a VOCS structure 106, a bottom spacer 130, a final gate structure (comprised of a gate insulation layer 132 and a conductive gate electrode 134), an encapsulating spacer 136, insulating material 138 (e.g., silicon dioxide or a low-k material), P-type-doped top source/drain regions 140P, N-type-doped top source/drain regions 140N, an etch stop layer 142, additional insulating material 144, and a plurality of device level conductive contacts 146A-G (collectively referenced using the numeral 146). Of course, the transistors 104 may comprise additional components, structures and/or layers of material that are not depicted in the drawings so as not to overly complicate the drawings. The device level conductive contacts 146A-G are conductively coupled to, respectively, the P-type-doped top source/drain region 140P for the transistor 104A, the conductive gate electrode 134 of the gate structure that is shared by the two P-type transistors 104A, 104B, the P-type-doped top source/drain region 140P for the transistor 104B, the merged doped source/drain region 129, the N-type-doped top source/drain region 140N for the transistor 104C, the conductive gate electrode 134 of the gate structure that is shared by the two N-type transistors 104C, 104D and the N-type-doped top source/drain region 140N for the transistor 104D. Typically, the metallization system (not shown) for the product 100 that is comprised of several levels of conductive lines and vias would be formed above the structure depicted in FIG. 16 beginning with an M0 level or an M1/V0 level.

The bottom spacer 130 may be formed to any desired thickness, e.g., 4-15 nm, and it may be formed from any desired insulating material, e.g., a low-k insulating material (k value of 7 or less), silicon dioxide and or silicon nitride, etc. In one embodiment, the bottom spacer 130 may be formed by performing a deposition process so as to over-fill the trenches with insulating material. Thereafter, the upper surface of the bottom spacer 130 may be planarized by performing, for example, a CMP process. Then, a timed selective recess etching process may be performed to recess the bottom spacer 130 to a desired residual thickness. In another embodiment, the bottom spacer 130 may be formed by performing a directional deposition process, such as a gas cluster ion beam (GCM) process or an HDP deposition process, to form the bottom spacer 130 substantially on only the horizontally oriented surfaces of the product 100.

The final gate structures for the various transistor devices 104 are representative in nature and they may be formed using gate-first or replacement-gate manufacturing techniques. Each of the gate structures comprises a gate insulation layer 132 and a conductive gate electrode 134. The gate insulation layer 132 may be comprised of a material such as silicon dioxide or a high-k (k value greater than 10) insulating material, $HfO_2$, $La_2O_3$, $Al_2O_3$, etc. The gate electrode 134 may be comprised of one or more of a variety of different conductive materials, e.g., a metal, a metal alloy, titanium nitride, tantalum nitride, tungsten, aluminum, poly-silicon, TiAlC, TiC, etc., and it may be formed to any desired thickness.

The P-type-doped top source/drain regions 140P may be formed by performing various operations to remove material so as to expose the upper surface of the VOCS structures 106 of the P-type transistors 104A, 104B. Thereafter, a P-type-doped epitaxy semiconductor material may be formed on the exposed upper surfaces of the VOCS structures 106. A similar process may be performed to form the N-type-doped top source/drain regions 140N.

The device level contacts 146 are intended to be representative in nature as they may be formed of any material and using any technique. For example, various contact openings were formed in the various layers of insulating material so as to expose desired contact portion of various structures on the transistor devices 104. Thereafter, one or more conformal conductive liners, e.g., Ti, TiN, were deposited in the contact openings and a bulk conductive material, e.g., tungsten, was deposited so as to over-fill the contact openings. Then, a CMP process or an etch-back process may be performed to remove the conductive material(s) from above the upper surface of the insulating material 144.

As will be appreciated by those skilled in the art, the ultimate goal of semiconductor lithography processes is to print a pattern accurately on the surface of a wafer. One of the key parameters of such photolithography processes is commonly known as edge placement error (EPE), a parameter that represents how accurately an edge of a patterned layer of photoresist material is actually placed (or located) relative to an ideal location of the edge of the photoresist if the photolithography were performed exactly in accordance with the ideal design case. Advanced technology such as scaled FinFET, nanowire/nanosheet, and/or vertical transfer FET are facing challenges driven by pitch scaling and its impact on source/drain epitaxy patterning. It is especially true for vertical transport transistor devices.

As will be appreciated by those skilled in the art after a complete reading of the present application, the methods disclosed herein insure that the substantially horizontally-oriented P-type-doped layer of epitaxy semiconductor material 116B and the substantially horizontally-oriented N-type-doped layer of epitaxy semiconductor material 124 do, in fact, engage one another since the N-type-doped layer of epitaxy semiconductor material 124 will be grown until it contacts and engages the etched edge 116X of the P-type-doped layer of epitaxy semiconductor material 116B. This ability to insure that the inversely doped regions actually engage one another is beneficial and may help to improve product yields.

In some other process flows, the merged source/drain regions may be formed by performing first and second ion implantation processes through first and second patterned implant masks, e.g., patterned layers of photoresist material. In such a process flow, the first ion implant process is performed through the first patterned implant mask to form one of the N-type or P-type doped regions in the merged source/drain region. Thereafter, the first implant mask is removed and the second patterned implant mask is formed above the substrate. At that point, the second ion implant process is performed through the second patterned implant mask to form the other one of the N-type or P-type doped region in the merged source/drain region. One of the problems with using dual ion implantation processes to form such a merged source/drain region is that, in some cases, one or both of the ion implant masks may be misaligned to such a degree relative to its intended position, i.e., they may exhibit significant edge placement error, that the N-type and P-type doped regions do not actually engage one another at the completion of the ion implantation process and/or at the completion of any subsequent anneal process. As a result of such non-engagement between the N-type and P-type doped regions; what was intended to be a merged source/drain region does not exist, thereby leading to product failure. Another problem with using the above-described dual ion implantation processes to form such a merged source/drain region is that such processing involves the formation of two separate patterned implant masks, e.g., two patterned layers of photoresist, which add time and expense to the formation of the IC product.

In contrast, as noted above, the methods disclosed herein only involve the formation of a singled patterned masking layer 121 (see, e.g., FIGS. 11 and 12), thereby reducing processing costs. The single photo-mask-lithography approach described herein also avoids the problems noted above with edge placement error when forming the two implantation masks. The methods disclosed herein use a self-aligned process to create "merged" source/drain regions comprised of epitaxy semiconductor material. The methods disclosed herein may be employed in a variety of different applications, such as, for example, the fabrication of SRAM (Static Random Access Memory) products, logic products, etc.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed is:

1. A method of forming a merged source/drain region, comprising:
    forming first and second vertically oriented channel semiconductor (VOCS) structures above a semiconductor substrate;
    forming a recess in said substrate between said first and second VOCS structures;
    forming a substantially horizontally-oriented P-type-doped semiconductor material in said recess;
    removing a first substantially horizontally-oriented portion of said substantially horizontally-oriented P-type-doped semiconductor material from within said recess while leaving a second substantially horizontally-oriented portion of said P-type-doped semiconductor material remaining in said recess; and
    forming a substantially horizontally-oriented N-type-doped semiconductor material in said recess laterally adjacent said second substantially horizontally-oriented portion of said P-type-doped semiconductor material, wherein said substantially horizontally-oriented N-type-doped semiconductor material physically engages said second substantially horizontally-oriented portion of said P-type-doped semiconductor material along an interface within said merged source/drain region.

2. The method of claim 1, further comprising, prior to removing said first substantially horizontally-oriented portion of said P-type-doped semiconductor material, forming a patterned etch mask above said P-type-doped semiconductor material that covers said second substantially horizontally-oriented portion of said P-type-doped semiconductor material and exposes at least a portion of said first substantially horizontally-oriented portion of said P-type-doped semiconductor material.

3. The method of claim 2, wherein removing said first substantially horizontally-oriented portion of said P-type-doped semiconductor material comprises performing an anisotropic etching process, with said patterned etch mask covering said second substantially horizontally-oriented portion of said P-type-doped semiconductor material, to remove said first substantially horizontally-oriented portion of said P-type-doped semiconductor material.

4. The method of claim 3, wherein removing said first substantially horizontally-oriented portion of said P-type-doped semiconductor material further comprises, after performing said anisotropic etching process, performing an isotropic etching process, with said patterned etch mask covering said second substantially horizontally-oriented portion of said P-type-doped semiconductor material, to remove said first substantially horizontally-oriented portion of said P-type-doped semiconductor material.

5. The method of claim 1, wherein forming said substantially horizontally-oriented P-type-doped semiconductor material in said recess comprises performing an epitaxial growth process while introducing a P-type dopant during said epitaxial growth process so as to form a substantially horizontally-oriented in situ P-type-doped semiconductor material in said recess.

6. The method of claim 1, wherein forming said substantially horizontally-oriented P-type-doped semiconductor material in said recess comprises:
    performing an epitaxial growth process to form an undoped substantially horizontally-oriented semiconductor material in said recess; and
    performing an ion implantation process to introduce a P-type dopant into said undoped substantially horizontally-oriented semiconductor material in said recess, thereby forming said P-type-doped semiconductor material.

7. The method of claim 1, wherein forming said substantially horizontally-oriented N-type-doped semiconductor material in said recess comprises performing an epitaxial growth process while introducing an N-type dopant during said epitaxial growth process so as to form a substantially horizontally-oriented in situ N-type-doped semiconductor material in said recess.

8. The method of claim 1, wherein said interface between said second substantially horizontally-oriented portion of P-type-doped semiconductor material and said substantially horizontally-oriented N-type-doped semiconductor material is a substantially vertically oriented interface.

9. The method of claim 1, further comprising:
    forming additional components of a P-type vertical transistor around said first VOCS structure; and
    forming additional components of an N-type vertical transistor around said second VOCS structure, wherein said P-type vertical transistor and said N-type vertical transistor are connected to each other by said merged source/drain region.

10. The method of claim 1, wherein said merged source/drain region is a part of an SRAM (Static Random Access Memory) cell.

11. The method of claim 1, wherein said substantially horizontally-oriented P-type-doped semiconductor material comprises one of boron (B), boron difluoride (BF2), and gallium (Ga) and said N-type-doped semiconductor material comprises one of phosphorous and arsenic.

12. The method of claim 1, wherein said substantially horizontally-oriented P-type-doped semiconductor material comprises silicon germanium (SiGe) having a germanium concentration of about 30-60% (atomic percent) and said substantially horizontally-oriented N-type-doped semiconductor material comprises one of phosphorous doped silicon and arsenic doped silicon.

13. A method of forming a merged source/drain region, comprising:
    forming first and second vertically oriented channel semiconductor (VOCS) structures above a semiconductor substrate;
    performing at least an anisotropic etching process to form a recess in said substrate between said first and second VOCS structures;
    performing a first epitaxial growth process while introducing a P-type dopant during said first epitaxial growth process so as to form a substantially horizontally-oriented in situ P-type-doped semiconductor material in said recess;
    removing a first substantially horizontally-oriented portion of said substantially horizontally-oriented in situ P-type-doped semiconductor material from within said recess while leaving a second substantially horizontally-oriented portion of said substantially horizontally-oriented in situ P-type-doped semiconductor material remaining in said recess; and
    performing a second epitaxial growth process while introducing an N-type dopant during said second epitaxial growth process so as to form a substantially horizontally-oriented in situ N-type-doped semiconductor material in said recess adjacent said second substantially horizontally-oriented portion of said substantially horizontally-oriented in situ P-type-doped semiconductor material, wherein said substantially horizontally-oriented in situ N-type-doped semiconductor material physically engages said second substantially horizontally-oriented portion of said substantially horizontally-oriented in situ P-type-doped semiconductor material along an interface within said merged source/drain region.

14. The method of claim 13, further comprising, prior to removing said first substantially horizontally-oriented portion of said substantially horizontally-oriented in situ P-type-doped semiconductor material, forming a patterned etch mask above said substantially horizontally-oriented in situ P-type-doped semiconductor material that covers said second substantially horizontally-oriented portion of said substantially horizontally-oriented in situ P-type-doped semiconductor material and exposes at least a portion of said first substantially horizontally-oriented portion of said substantially horizontally-oriented in situ P-type-doped semiconductor material.

15. The method of claim 14, wherein removing said first substantially horizontally-oriented portion of said substantially horizontally-oriented in situ P-type-doped semiconductor material comprises performing at least an anisotropic etching process, with said patterned etch mask covering said second substantially horizontally-oriented portion of said P-type-doped semiconductor material, to remove said first substantially horizontally-oriented portion of said substantially horizontally-oriented in situ P-type-doped semiconductor material.

16. The method of claim 15, wherein removing said first substantially horizontally-oriented portion of said substantially horizontally-oriented in situ P-type-doped semiconductor material further comprises performing an isotropic etching, with said patterned etch mask covering said second substantially horizontally-oriented portion of said substantially horizontally-oriented in situ P-type-doped semiconductor material, to remove said first substantially horizontally-oriented portion of said substantially horizontally-oriented in situ P-type-doped semiconductor material.

17. The method of claim 13, wherein said interface between said second substantially horizontally-oriented portion of said in situ P-type-doped semiconductor material and said substantially horizontally-oriented in situ N-type-doped semiconductor material is a substantially vertically oriented interface.

18. The method of claim 13, further comprising:
    forming additional components of a P-type vertical transistor around said first VOCS structure; and
    forming additional components of an N-type vertical transistor around said second VOCS structure, wherein said P-type vertical transistor and said N-type vertical transistor share said merged source/drain region.

19. The method of claim 13, wherein said merged source/drain region is a part of an SRAM (Static Random Access Memory) cell.

* * * * *